United States Patent [19]

Chu et al.

[11] 4,383,166
[45] May 10, 1983

[54] AUTOMATIC ECHO-CHAMBER FOR MEASURING SINGLE TIME INTERVALS BY REPLICATION AND AVERAGING

[75] Inventors: David C. Chu, Woodside; Robert W. Offermann, Saratoga, both of Calif.

[73] Assignee: Hewlett-Packard Company, Palo Alto, Calif.

[21] Appl. No.: 136,142

[22] Filed: Mar. 31, 1980

[51] Int. Cl.³ .................. H03K 21/32; G07C 1/02
[52] U.S. Cl. .................................. 377/20; 368/119; 377/44
[58] Field of Search ............ 235/92 T, 92 TF, 92 CC, 235/92 DM, 92 PS, 92 PQ; 368/119

[56] References Cited

U.S. PATENT DOCUMENTS

| | | | |
|---|---|---|---|
| 3,133,189 | 5/1964 | Bagley et al. | 235/92 TF |
| 3,505,594 | 4/1970 | Tarczy-Hornoch et al. | 368/119 |
| 3,611,134 | 10/1971 | McDowell | 368/119 |
| 3,886,451 | 5/1975 | Chu et al. | 235/92 TF |
| 3,938,042 | 2/1976 | Gliever et al. | 235/92 PS |
| 4,164,648 | 8/1979 | Chu | 235/92 FQ |
| 4,165,459 | 8/1979 | Curtice | 235/92 TF |

OTHER PUBLICATIONS

"1 Nanosecond Time Interval Counter", Patrick Young, *Instruments & Control Systems*, Jan. 1965, p. 105.

*Primary Examiner*—Joseph M. Thesz
*Attorney, Agent, or Firm*—Edward Y. Wong

[57] ABSTRACT

A method is provided for measuring a single-shot time interval using startable oscillators to replicate indefinitely the time interval for averaging. Also provided is a circuit for automatically selecting a proper ratio of division to ensure that the interval being measured is less than the period of replication.

7 Claims, 4 Drawing Figures

AUTOMATIC ECHO-CHAMBER FOR MEASURING SINGLE TIME INTERVALS BY REPLICATION AND AVERAGING

BACKGROUND OF THE INVENTION

One method for measuring time intervals is by directly counting the lapse of time in the interval. Such a method is described in Hewlett-Packard Application Note 172, "The Fundamentals of Electronic Frequency Counters," pp. 23 ff. In this method, the start event opens a gate to allow a reference clock to be counted until the stop event closes it. Since the maximum resolution of this method is one clock period, there is a ±1 count ambiguity. Therefore, methods to improve the resolution have been devised. One direct method is to decrease the significance of the ±1 ambiguity by increasing the clock frequency. This method, however, often requires more sophisticated and costly circuits for implementation. Furthermore, a typical commercial instrument using this method has only an approximately 1-2 nanosecond resolution at best.

For repetitive time intervals, the time interval can be repetitively measured and averaged. As a result, the resolution of the measurement is improved by the averaging due to the statistical nature of the ± count ambiguity. The resolution is improved by a factor of $1/\sqrt{A}$, where A is the number of intervals averaged. See, for instance, HP AN 172, pp. 30-31. If the reptition rate of the interval is coherent with the clock, however, there would be no difference in the results of the repeated measurements, and no improvement would be achieved by such an averaging. For such cases, special techniques must be used for averaging to take place. See David C. Chu, "Time Interval Averaging: Theory, Problems, and Solutions," *Hewlett-Packard Journal*, June 1974, pp. 12-15 and U.S. Pat. No. 3,886,451.

Several methods have been developed for interpolating between clock pulses to achieve higher resolution without averaging. One method, described in U.S. Pat. No. 3,133,189; Gilbert A. Reeser, "An Electronic Counter for the 1970's," *Hewlett-Packard Journal*, May 1969, pp. 9-12; and Ronald Nutt, "Digital Time Intervalometer," *The Review of Scientific Instruments*, Vol. 39, No. 9, Sept. 1968, pp. 1342-1345, involves charging a capacitor at a rapid rate and discharging it at a much slower rate. With a much slower rate, the discharge time can be measured directly. This technique is used to determine both the start and the stop ambiguities, and the two numbers thus derived are combined arithmetically with the direct count measurement to give the final result. A second interpolation method, described in U.S. Pat. No. 3,218,553 and by Patrick Young, "1 Nanosecond Time Interval Counter," *Instruments & Control Systems*, uses two startable oscillators slightly offset from each other in frequency to give a vernier interpolation. One oscillator output signal is started by the start signal so there would be no start ambiguity; it is counted directly. The second oscillator output signal of a slightly higher frequency is started by the stop signal and is counted until it becomes coincident with the first oscillator output signal, thus giving a vernier interpolation of the stop ambiguity. Both of these methods require the ability to combine arithmetically several numbers, a capability that does not normally exist without special circuitry. In addition, the implementation of these methods themselves may require sophisticated and specialized circuitry.

The interpolation methods discussed above have been used in generally available production instruments. There are also some methods that have been developed and used in specialized applications, e.g., for nuclear physics. Examples of these specialized methods include the technique of time to pulse height conversion; the chronotron technique, which uses incremental delay elements of slightly different lengths in the start and stop channels; and a technique that involves forming a pulse whose width is equal to the time interval. In the last method mentioned, the pulse formed is sent down a delay line and the output of the delay line is used to form another pulse. In this manner, the time interval is repeated. See the descriptions in William H. Venable, Jr., "Tunnel Diode Chronotron Circuit for Picosecond Range," *The Review of Scientific Instruments*, Vol. 37, No. 11, November 1966, pp. 1443-1449 and Gunther Franke, Roberto Pevararo and Heinz Fischer, "Measuring Nanosecond Time Differences by Dynamic Storage of Flip-Flop Pulses," *Proceedings of the IEEE*, Vol. 56, February 1968, pp. 221-222. This method, though, suffers from limitations such as a restricted operation range and degradation of the repeated interval due to unmatched delays. The present invention also involves reproducing the time interval to be measured. However, it does not suffer from these limitations.

SUMMARY OF THE INVENTION

In accordance with a preferred embodiment of the present invention, the phase difference between two oscillator signals corresponds with the single occurrence of a time interval between a start and a stop event, i.e., a single-shot time interval. One oscillator is started in phase with the start event, as indicated by a start input signal, and the other in phase with the stop event, as indicated by a stop input signal. The phase difference between the two oscillator signals corresponds to the time interval to be measured. The oscillators are phase locked to the same reference oscillator. Therefore, the phase difference between the two oscillators can be preserved indefinitely and this phase difference can then be used to thereafter create a repetitive replication of the time interval. These replications of the time interval can then be repeatedly measured and averaged by standard time interval averaging techniques well-known in the art. However, when the interval is longer than the period of the oscillators, and when the outputs of the oscillators are measured directly, there is an ambiguity problem in the measurement, viz., an intergral number of clock periods would be ignored and only the fractional clock period would be measured. A divider placed on the output of each oscillator overcomes this potential ambiguity. The divider, however, should not be fixed; a fixed divider of sufficient length to accommodate all anticipated intervals would make the measurement time unacceptably long for shorter intervals. Therefore, the preferred embodiment of the invention also includes a multiple decade divider chain with circuitry for automatically selecting the "decade" step for division having the maximum repetition rate that will give the correct result for each measurement. These decade steps, however, are not actually exact decades due to restrictions placed on the division in order to obtain accurate averaging.

DESCRIPTION OF THE PREFERRED EMBODIMENT

The invention may be best understood by first referring to a preferred embodiment of the invention as depicted in FIGS. 1–4 and discussing its novel aspects and operation. Subsequently, the general theory of the present invention is discussed.

Figure 1:
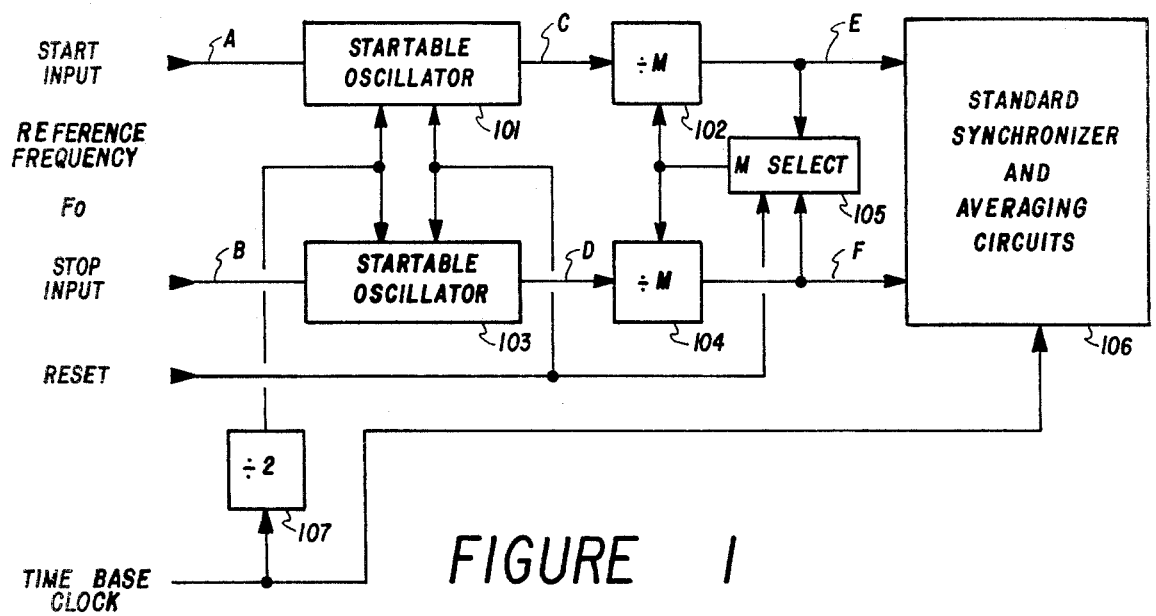
FIG. 1 shows a block diagram of an apparatus in accordance with an embodiment of the present invention.
Figure 2:
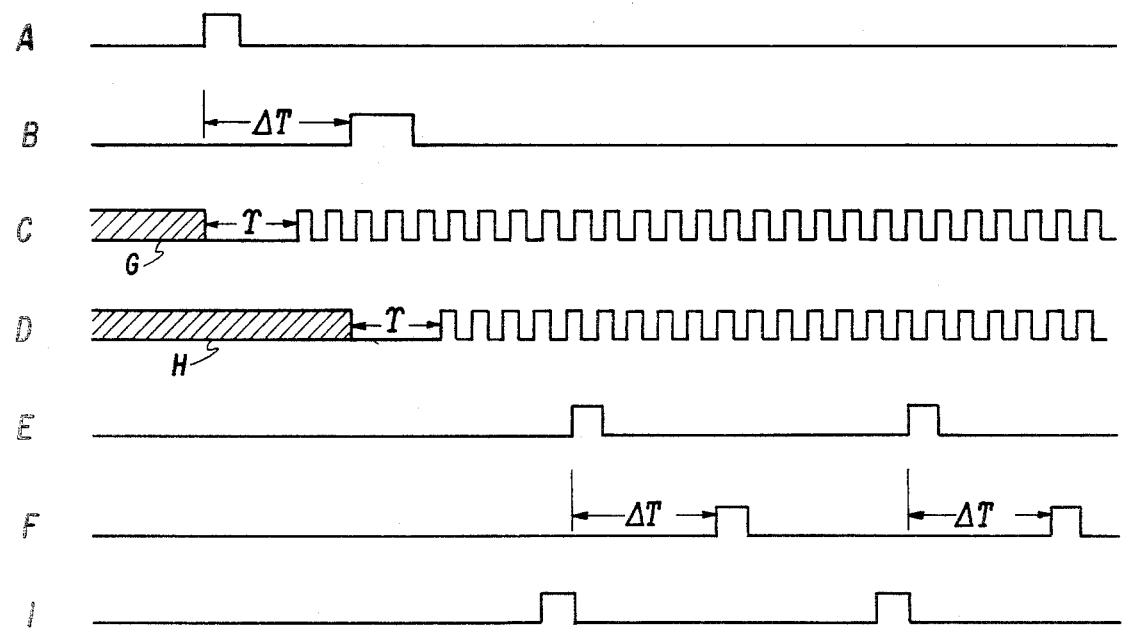
FIG. 2 illustrates the waveforms of various signals within the apparatus.
Figure 3:
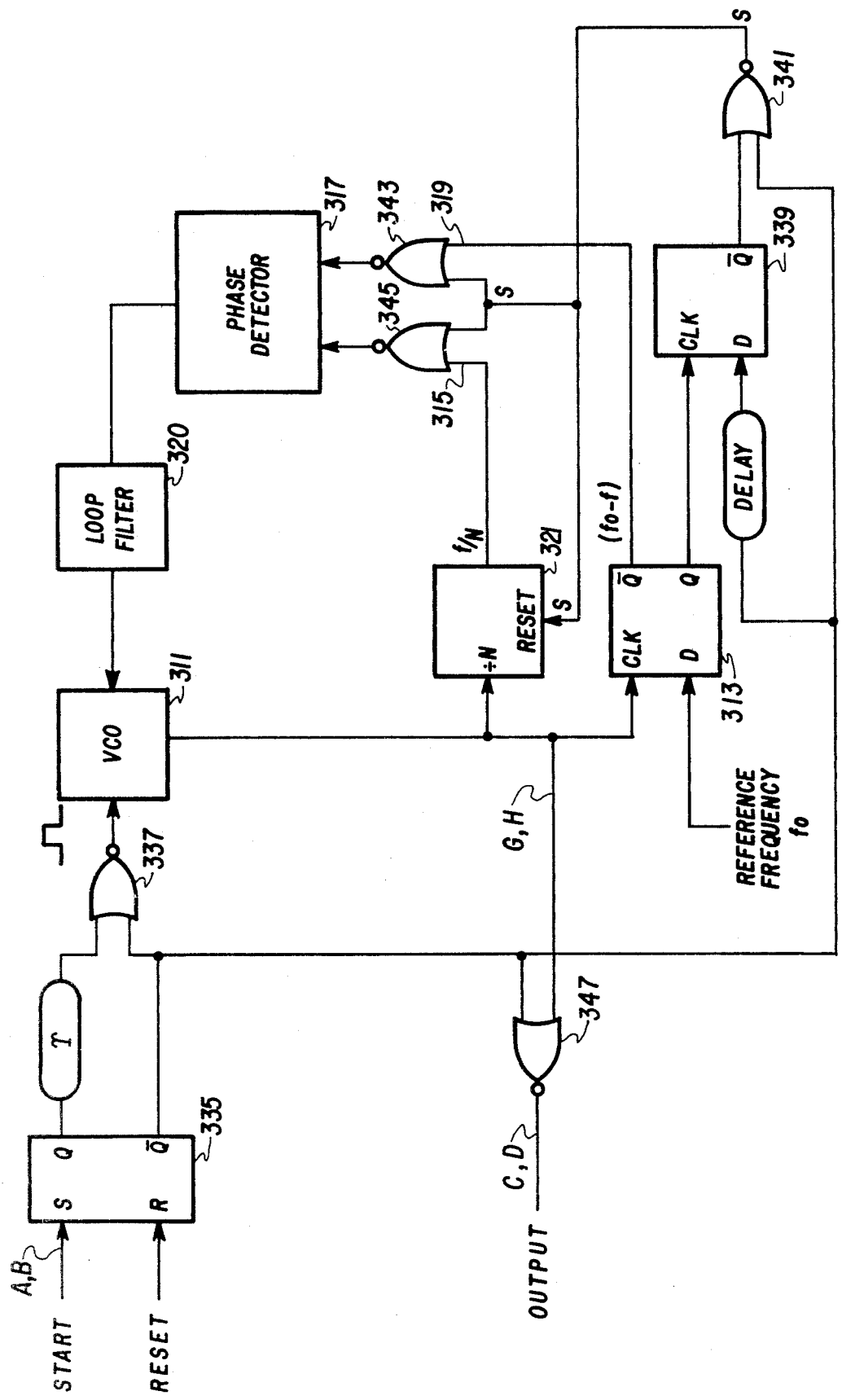
FIG. 3 depicts a typical startable oscillator used in the apparatus. It can be representative of the start channel or the stop channel.

FIG. 1 shows a block diagram of an apparatus in accordance with an embodiment of the present invention, and FIG. 2 shows some of the waveforms that occur. The apparatus comprises two startable phase-locked oscillators 101, 103 (such as the type described in U.S. Pat. No. 3,921,095, two divider chains 102, 104, an M-select circuit 105 that automatically selects the optional divisor from among the choices available (such as that shown in FIG. 4), and standard circuitry 106 well-known in the art for synchronizing an averaging the time lapse between two events (such as the circuitry in the HP 5345A counter). The two startable oscillators are substantially identical to each other. FIG. 3 is a block diagram of the startable oscillator of the type described in U.S. Pat. No. 3,921,095. It could represent either the start signal channel 101 or stop signal channel 103. Upon receipt of an input signal A, B at the start of an event, a gate 337 produces a pulse of width $\tau$. In the present embodiment of the invention, $\tau = 65$ nanoseconds. This pulse switches off a voltage controlled oscillator (VCO) 311, which has been running locked to a reference frequence $f_o$ at some arbitrary phase G, H. At the end of time $\tau$, the VCO starts again. It always restarts at zero phase (rising edge), and it relocks to the reference at this new phase C, D. Thus, the new phase of the oscillator is directly related to the timing of the input signal. The frequency of the oscillator f is $$f = f_o \frac{N}{N+1}, \quad (1)$$

where $f_o$ is the reference frequency and N is the internal divider of the phase locked loop. The reference frequency $f_o$ is derived from a time base clock for the time interval average measurement circuitry 106 through a divide-by-two circuit 107. In this way, the reference oscillator and circuitry 107 are coherent. In the present embodiment of the invention, $f_o = 50$ MHz and $N = 200$. When the oscillator is reset, an output gate 347 cuts off the output, the VCO continues to run, and the loop remains locked between measurements without disturbing other circuits. In FIG. 2 the heavy base lines at the start of waveforms C and D refer to the VCO outputs in general, while the shaded areas G and H represent the VCO outputs of frequency f but with arbitrary phases before the input signals are received. After the signals are received, the output gate is opened; these two signals are identical until a reset pulse is received.

Using the above described embodiment of the invention for a start signal channel and a stop signal channel results in a signal representative of a replication E of the start signal A and a signal representative of a replication F of the stop signal B. The relationship of these signals are the waveforms illustrated in FIG. 2. The repeated time interval $\Delta T$ between signals E and F in the figure is a replication of the time interval to be measured. This measurement can be accomplished by a standard circuitry for synchronizing and averaging 106 well-known in the prior art.

It should be noted that while FIG. 3 represents the configuration of the startable oscillator used in the present implementation of the inventions, there are other configurations apparent to those skilled in the art that could also work. For example, the input of a divider chain 321 could be connected to the reference frequence $f_o$ instead of the VCO output frequency f. In this case $$f = f_o \frac{N-1}{N} \quad (2)$$

This case would work equally well. The most general case is shown in FIG. 1 of U.S. Pat. No. 3,921,095, where the input of the divider chain is a completely independent frequency.

Figure 4:
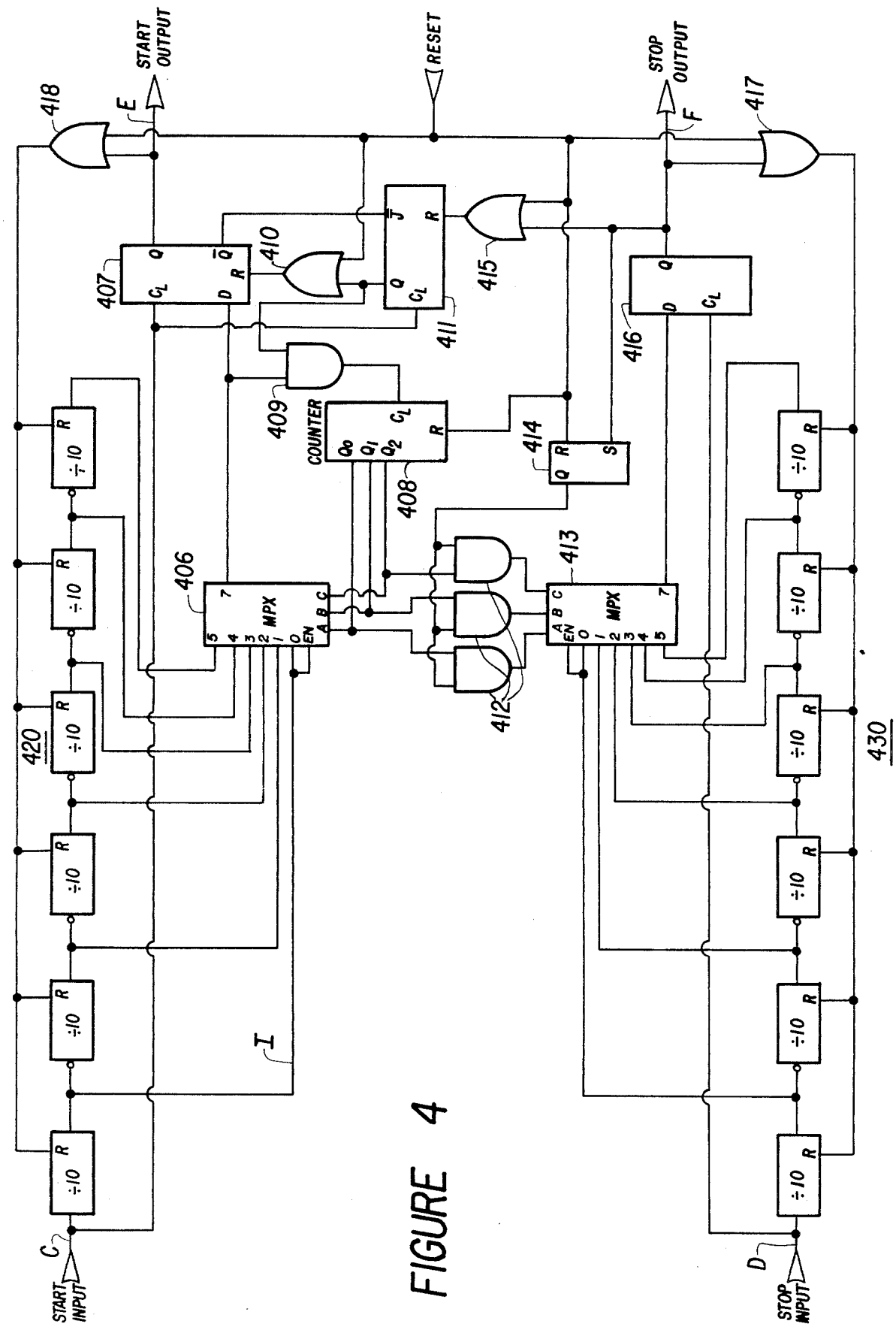
FIG. 4 is a schematic of the circuitry for dividing a start signal and a stop signal and for selecting a predetermined integer M automatically.

FIG. 4 is a schematic of divider and M-select circuits (blocks 102, 104, and 105 in FIG. 1). The purpose of circuits 102, 104, 105 is to reduce the frequency E, F seen by standard measuring circuits so that the period is longer than the time interval being measured, thus allowing the correct measurement to be made. The dividers put out one output pulse for every M input pulses, while the select circuit monitors the two outputs and increases M until the output period is longer than the interval being measured. There is a multiple decade divide chain (6 decades in the current implementation) for each start or stop channel, multiplexers 406, 413 for gating out the proper decade, and flip-flops 407, 416 for adding one count to the division in order to allow averaging to take place. The rationale for this step will be apparent in the discussion below. There is also circuitry 408–412, 414, 415 for selecting M, or decade-divider select circuits. These circuits are used to determine the decade (M) that must be selected to give the shortest period that is longer than the interval being measured. At the beginning of a measurement the decade dividers, counter 408 and flip-flops 407, 411, 414 have been reset. Thus, the output of the counter is 0; so input 0 of multiplexer 406 is selected and connected to its output. Input 0 is connected to the output of the first decade of the start channel divide chain. Similarly the output of multiplexer 413 is connected to its input 0, which is connected to the output of the first decade of the stop channel divider chain. On the ninth count of the start input C, the output of the first decade of the start divider chain 420 goes high, and this signal is routed through multiplexer 406 to the D input of flip-flop 407. The next input pulse at C then clocks start output E (Q of flip-flop 7) high as shown in FIG. 2, traces C and E. This output signal also resets the entire divide chain to zero and prevents it from counting the next input pulse, the eleventh. Since the dividers have been reset and the input of flip-flop 407 is low, this input pulse resets the output to zero and returns the divider chain in its initial condition. This pulse also sets the Q output of flip-flop 411 high, which serves two purposes. Through gate 410 it keeps flip-flop 407 from being set, thus preventing another start channel output. It also opens gate 409, allowing any pulses out of multiplexer 406 to increment counter 408, thus increasing the number M by which the input is divided to the next value of M. Flip-flop 411 is reset by stop channel output F, which is the Q output of flip-flop 416. The stop channel divider chain works analogously to the start channel, so the first output will come on the tenth input pulse. Thus, if there are ten pulses on stop input D before the twenty-first pulse on start input C, flip-flop 411 will have been reset and the start channel will be allowed to output normally, leaving M at its lowest value, which is 11. If a stop output pulse F has not occurred, the twenty-first start input pulse C will cause counter 408 to increment and the start divider chain will continue to count. This sequence continues to happen, with ever increasing intervals between increments, until there have been ten pulses at the stop input. Gates 412 keep the stop multiplexer from selecting a decade other than the first one until after the first stop output. In this way, the stop as well as the start channel puts out its first pulse after the tenth input pulse. The first stop output sets the Q output of flip-flop 414 high, opening gates 412. When higher order decades are selected, the divide chains function in the same manner as they do for the first decade, with the exception that the output of the first decade is ANDed and with that of the selected decade by using it as the enable signal for the multiplexer. The values of M available for the configuration shown in FIG. 4 are 11, 101, 911, 9,011, 90,011, and 900,011. Thus, with a chosen startable oscillator period of 20.1 nanoseconds, for example, the maximum time interval that can be measured with this configuration is therefore 18.1 milliseconds. This range can be increased by adding more decades to the divide chains.

The theory behind the invention follows. As was stated previously, the frequency of the startable oscillator is $f_o \cdot N/(N+1)$, where $f_o$ is the reference frequency and N is the internal divide ratio of a phase-locked loop. In the time domain, the period of the startable oscillator is $$\tau = \frac{1}{f_o} \cdot \frac{N+1}{N} = \tau_o \left(1 + \frac{1}{N}\right), \quad (3)$$

where $1/f_o = \tau_o$. It is thus offset from the reference period by a factor of $1/N$, which is the interpolation factor of the startable oscillator. The maximum resolution, R, that can be obtained is therefore $\tau_o/N$. If $\tau_c$ is the period of the master clock of the counter (i.e., of the time base clock that is counted to measure the time interval), then there are $$\frac{\tau_c}{\tau_o/N} = \frac{\tau_c N}{\tau_o} = A$$

states, or intervals $\tau_o/N$ long, in each master clock period. In order to achieve the maximum resolution R, a measurement must be made in each of the A possible phase relationships, so A is the minimum number of periods that must be averaged to achieve R. The number of intervals $\tau_o/N$ long in a period of the startable oscillator is $$\frac{\tau_o(1 + 1/N)}{\tau_o/N} = N(1 + 1/N) = N + 1. \quad (4)$$

In order for averaging to occur properly, it is necessary that $\tau_c N/\tau_o$ be relatively prime to $N+1$ (i.e., they must contain no common factors), assuring that a measurement is made in each phase relationship before there is any repetition. This is due to the fact that the startable oscillators are coherent with the counter master clock. For this reason also, the number of intervals averaged must be exactly A or an integral multiple of A unless further restrictions are observed in order to assure that the fraction of the A possible states that are averaged are not all grouped together with respect to the clock phase, biasing the result. If these restrictions are observed, then averaging A intervals gives a resolution of $\tau_o/N = \tau_c/A$, or an improvement factor of A over a direct count measurement with a clock period of $\tau_c$. This compares to an improvement factor of substantially only $\sqrt{A}$ that would be obtained with normal statistical averaging. The resolution of $\tau_o/N$ is for each oscillator, so the resolution of an echo chamber using two startable oscillators is $2\tau_o/N$.

When the output of the startable oscillators is divided by a number M in order to make the apparent oscillator period larger than the interval being measured, the "echo period" becomes $M \cdot \tau_o(1 + 1/N)$, so the number of $\tau_o/N$ length intervals in the echo period is $$\frac{M\tau_o(1 + 1/N)}{\tau_o/N} = M(1 + 1/N)N = M(N + 1). \quad (5)$$

In order for averaging to take place in this case, $M(N+1)$ must be relatively prime to $\tau_c N/\tau_o$. In the present embodiment of the invention $\tau_c = 10$ nanoseconds, $\tau_o = 20$ nanoseconds and $N = 200$.

Therefore, $$R = \tau_o/N = 20 \text{ ns}/200 = 100 \text{ picoseconds, and} \quad (6)$$

$$A = \tau_c N/\tau_o = (10 \text{ ns}/20 \text{ ns}) \cdot 200 = 100 \quad (7)$$

For averaging to take place, $201 \cdot M$ must be relatively prime to 100, so M must contain no factors of 2 or 5. This explains the unusual values of M that were chosen.

I claim:

1. A method for measuring a time interval, the method comprising the steps of:
    selecting the phase of a first oscillator in a constant predetermined relationship to the phase of a reference oscillator in response to a start event, said first oscillator having an output of periodic pulses;
    selecting the phase of a second oscillator in a constant predetermined relationship to the phase of said reference oscillator in response to a stop event, said second oscillator having an output of periodic pulses;
    forming replications of said start and stop events from the outputs of said first and second oscillators by:
        scaling the output of said first oscillator to provide a first signal of periodic pulses having a pulse period equal to the period of M pulses of said first oscillator output, where M is a predetermined integer and said first signal is a repetitive replication of a start event mark; and scaling the output of said second oscillator to provide a second signal of periodic pulses having a pulse period equal to the period of M pulses of said second oscillator output, where M is said predetermined integer and said second signal is a repetitive replication of a stop event mark; and measuring the time intervals between said replicated start and stop event marks to determine the time interval between said start and stop events.

2. The method as in claim 1, wherein said first and second oscillators are startable oscillators phased locked to said reference oscillator.

3. An apparatus for measuring a single shot time interval comprising:

first oscillator responsive to an input start signal to provide an output with a phase fixed in relation to a reference oscillator to mark a start event;

second oscillator responsive to an input stop signal to provide an output with a phase fixed in relation to said reference oscillator to mark a stop event;

first scaling means for producing a first signal output having a pulse period equal to the period of M pulses of said first oscillator output signal appearing at the input of said first scaling means, where M is a predetermined integer and said first signal is a replication of the start event mark;

second scaling means for producing a second signal output having a pulse period equal to the period of M pulses of said second oscillator output signal appearing at the input of said second scaling means, where M is said predetermined integer and said second signal is a repetitive replication of the stop event mark; and measuring means responsive to said first and second signal outputs to provide an output proportional to the time interval between said start and stop events.

4. The apparatus as in claim 3, wherein said first and second oscillators are startable oscillators.

5. An apparatus for measuring a single shot time interval comprising:

first oscillator responsive to an input start signal to provide an output with a phase fixed in relation to a reference oscillator to mark a start event;

second oscillator responsive to an input stop signal to provide an output with a phase fixed in relation to said reference oscillator to mark a stop event;

first scaling means for producing a first signal output having a pulse period equal to the period of M pulses of said first oscillator output signal appearing at the input of said first scaling means, where M is a predetermined integer and said first signal is a replication of the start event mark;

second scaling means for producing a second signal output having a pulse period equal to the period of M pulses of said second oscillator output signal appearing at the input of said second scaling means, where M is said predetermined integer and said second signal is a repetitive replication of the stop event mark;

M-select circuit means responsive to the outputs of said first and second scaling means for automatically selecting said integer M such that the period of said first and second signals is longer than the time interval being measured; and measuring means responsive to said first and second signal outputs to provide an output proportional to the time interval between said start and stop events.

6. The apparatus as in claim 5, wherein said first and second oscillators are startable oscillators.

7. The apparatus as in claim 5, wherein said M-select circuit means comprises:

first multiplexer for accepting outputs from the first scaling means to produce an output pulse to increment a counter circuit and to gate a first flip-flop;

second multiplexer for accepting outputs from the second scaling means to produce an output pulse to gate a second flip-flop;

first flip-flop responsive to the first oscillator output and first multiplexer output pulse for producing start mark pulses and reset pulses for the first scaling means;

second flip-flop responsive to the second oscillator output and second multiplexer output pulse for producing stop mark pulses and reset pulses for the second scaling means;

counter circuit responsive to outputs from a third flip-flop and from said first mutiplexer to select the proper outputs for said first and second multiplexer;

third flip-flop responsive to the stop mark pulses for producing an output pulse to reset the first flip-flop and to stop said counter circuit from being incremented further by the first multiplexer output; and gating means responsive to the counter circuit outputs for selecting the outputs of said first and second multiplexers, thereby in effect selecting the proper decade for M such that the periods of the start mark pulses and the stop mark pulses are greater than the interval between the start and stop mark pulses, that is, the time interval being measured.

* * * * *

UNITED STATES PATENT AND TRADEMARK OFFICE
CERTIFICATE OF CORRECTION

PATENT NO. : 4,383,166
DATED : May 10, 1983
INVENTOR(S) : David Chau-Kwong Chu and Robert William Offermann It is certified that error appears in the above—identified patent and that said Letters Patent is hereby corrected as shown below:

Column 3, line 30, delete "optional" and insert -- optimal --.

Signed and Sealed this

First Day of November 1983

[SEAL]

Attest:

GERALD J. MOSSINGHOFF

Attesting Officer　　Commissioner of Patents and Trademarks